United States Patent
Buell et al.

(10) Patent No.: US 9,479,177 B1
(45) Date of Patent: Oct. 25, 2016

(54) SELF-CALIBRATING FRACTIONAL DIVIDER CIRCUITS

(71) Applicant: Integrated Device Technology, Inc., San Jose, CA (US)

(72) Inventors: Brian Buell, Gilbert, AZ (US); Li Tao, Chandler, AZ (US); Song Gao, Chandler, AZ (US)

(73) Assignee: INTEGRATED DEVICE TECHNOLOGY, INC, San Jose, CA (US)

( * ) Notice: Subject to any disclaimer, the term of this patent is extended or adjusted under 35 U.S.C. 154(b) by 133 days.

(21) Appl. No.: 14/575,212

(22) Filed: Dec. 18, 2014

(51) Int. Cl.
*H03K 23/00* (2006.01)
*H03K 21/02* (2006.01)
*H03L 7/18* (2006.01)
*H03L 7/197* (2006.01)
*H03L 7/193* (2006.01)
*H03K 23/68* (2006.01)

(52) U.S. Cl.
CPC ............... *H03K 21/02* (2013.01); *H03K 23/68* (2013.01); *H03L 7/1806* (2013.01); *H03L 7/193* (2013.01); *H03L 7/1974* (2013.01); *H03L 7/1976* (2013.01)

(58) Field of Classification Search
None
See application file for complete search history.

(56) References Cited

U.S. PATENT DOCUMENTS

| | | | |
|---|---|---|---|
| 4,686,488 A | 8/1987 | Attenborough | |
| 5,079,521 A | 1/1992 | Gaskell et al. | |
| 6,064,272 A | 5/2000 | Rhee | |
| 6,353,649 B1 | 3/2002 | Bockleman et al. | |
| 6,621,317 B2 | 9/2003 | Saeki | |
| RE40,424 E | 7/2008 | Han et al. | |
| 7,417,510 B2 | 8/2008 | Huang | |
| 7,450,680 B2 | 11/2008 | Mar | |
| 7,532,081 B2 | 5/2009 | Partridge et al. | |
| 7,593,496 B2 | 9/2009 | Fan et al. | |
| 7,724,097 B2 | 5/2010 | Carley et al. | |
| 7,969,251 B2 | 6/2011 | Fu et al. | |
| 8,248,175 B2 | 8/2012 | Hara | |
| 8,441,291 B2 | 5/2013 | Hara et al. | |
| 8,559,587 B1 | 10/2013 | Buell et al. | |
| 8,692,599 B2 | 4/2014 | Gong et al. | |

(Continued)

OTHER PUBLICATIONS

Efstathiou, Dimitrios, "A Digital Loop Filter for a Phase Locked Loop", 17th International Conference on Digital Signal Processing (DSP), 2011, © 2011 IEEE, pp. 1-6.
Floyd, Brian A., "Sub-Integer Frequency Synthesis Using Phase-Rotating Frequency Dividers", IEEE Transactions on Circuits and Systems—I: Regular Papers, vol. 55, No. 7, Aug. 2008, pp. 1823-1833.
$I^2C$-Programmable Any-Frequency, Any-Output Quad Clock Generator—Si5338, Silicon Labs, Rev.1.0 1/11, Copyright © 2011 by Silicon Laboratories, 42 pages.

(Continued)

*Primary Examiner* — Tuan T Lam
(74) *Attorney, Agent, or Firm* — Myers, Bigel & Sibley, P.A.

(57) ABSTRACT

A fractional divider (FD) includes a multi-modulus divider (MMD), which generates a periodic output signal in response to: (i) a periodic reference signal ($REF_{HF}$), and (ii) a modulus control signal having a value that sets a frequency division ratio (1/P, 1/(P+1)) to be applied to the periodic reference signal. A phase correction circuit is provided, which generates an FD output signal in response to the periodic MMD output signal and a corrected multi-bit phase correction control (CPCC) signal during an active mode of operation. The phase correction circuit further generates an FD output signal in response to the periodic MMD output signal and a preliminary multi-bit phase correction control (PPCC) signal during a calibration mode of operation. A control circuit is provided, which generates the modulus control signal, the PPCC signal and the CPCC signal during the active mode of operation.

17 Claims, 8 Drawing Sheets

(56) References Cited

U.S. PATENT DOCUMENTS

| | | |
|---|---|---|
| 2003/0048863 A1 | 3/2003 | Saeki |
| 2004/0211819 A1 | 10/2004 | Ezumi et al. |
| 2005/0094757 A1 | 5/2005 | Meninger et al. |
| 2006/0290391 A1* | 12/2006 | Leung .................. H03L 7/1976 327/147 |
| 2007/0139088 A1* | 6/2007 | Garlapati ............... H03K 23/66 327/115 |
| 2007/0211819 A1* | 9/2007 | Greenberg .............. H03K 3/84 375/295 |
| 2007/0236297 A1* | 10/2007 | Uozumi ............... H03C 3/0925 331/16 |
| 2007/0247233 A1* | 10/2007 | Keaveney ................. H03L 7/07 331/1 A |
| 2011/0095830 A1 | 4/2011 | Tsangaropoulos et al. |

OTHER PUBLICATIONS

Li Zhang et al., entitled "A Hybrid Spur Compensation Technique for Finite-Modulo Fractional-N Phase-Locked Loops", IEEE Journal of Solid-State Circuits, vol. 44, No. 11, pp. 2922-2934, Nov. 2009.

Rohde, Ulrich L., Synthesizer Design for Microwave Application, Department of Electrical Engineering, Universities of Oradea, Bradford, and George Washington, Copyright © 1999, by Ulrich L. Rohde—p. 1 of 51.

S. Pamarti et al., entitled "A Spur Elimination Technique for Phase Interpolation-Based Fractional-N PLLs", IEEE Trans. On Circuits and Systems, vol. 55, No. 6, pp. 1639-1647, Jul. 2008.

Shu et al., CMOS PLL Synthesizers: Analysis and Design, Chapter 2, Springer Science+Business Media, 2005, pp. 16-19.

* cited by examiner

SELF-CALIBRATING FRACTIONAL DIVIDER CIRCUITS

CROSS-REFERENCE TO RELATED APPLICATION

This application is related to U.S. application Ser. No. 14/573,146, filed Dec. 17, 2014, entitled "Fractional Divider Based Phase Locked Loops with Digital Noise Cancellation," the disclosure of which is hereby incorporated herein by reference.

FIELD

The present invention relates to frequency synthesizer circuits and, more particularly, to frequency synthesizer circuits that perform fractional division of high frequency reference signals.

BACKGROUND

Fractional-N frequency synthesizers can be used to overcome many limitations associated with integer-N frequency synthesizers. In fractional-N frequency synthesizers, the effective frequency divide ratio is a fractional number, which enables a relatively high frequency reference signal to be used to achieve fine resolution of frequencies in synthesizer output signals. This fractional number is typically achieved by periodically changing an integer divide ratio so that a desired fractional number can be approximated. One typical disadvantage associated with fractional-N frequency synthesis is the generation of unwanted low-frequency "spurs" by a dual-modulus (or multi-modulus) divider. These spurs make fractional-N frequency synthesizers impractical for many applications unless they are suppressed to a negligible level. Conventional spur reduction techniques include: (i) digital-to-analog (DAC) phase estimation, (ii) random jittering, which randomizes a divide ratio, (iii) sigma-delta (ΣΔ) noise shaping, which modulates a divide ratio, (iv) phase interpolation; and (v) pulse generation. Some of these spur reduction techniques are disclosed in articles by: S. Pamarti et al., entitled "A Spur Elimination Technique for Phase Interpolation-Based Fractional-N PLLs", IEEE Trans. on Circuits and Systems, Vol. 55, No. 6, pp. 1639-1647, July (2008); and Li Zhang et al., entitled "A Hybrid Spur Compensation Technique for Finite-Modulo Fractional-N Phase-Locked Loops", IEEE Journal of Solid-State Circuits, Vol. 44, No. 11, pp. 2922-2934, November (2009).

As illustrated by FIG. 1A, a frequency synthesizer 10 may include a fractional-N divider 12 within a feedback path of a phase-locked loop (PLL), which filters jitter in the output of the divider 12. This fractional-N divider 12 may operate by modulating between two or more integer values. The phase-locked loop of FIG. 1A contains a phase detector 14, which receives an input reference signal (e.g., 25 MHz), a charge pump 16, a loop filter 18 and a voltage-controlled oscillator (VCO) 20. This VCO 20 generates an output signal having a frequency that is a non-integer multiple of the frequency of the input reference signal. An integer divider 22 may also be provided for generating an output signal at a reduced frequency relative to the VCO output signal. Examples of the frequency synthesizer 10 of FIG. 1A are disclosed at U.S. Pat. No. 7,532,081 to Partridge et al., entitled "Frequency and/or Phase Compensated Microelectromechanical Oscillator," and FIG. 3 of U.S. Pat. No. 7,417,510 to Huang, entitled "Direct Digital Interpolative Synthesis".

FIG. 1B illustrates a frequency synthesizer 10', which includes an integer divider 12' within a feedback path of a phase-locked loop (PLL). This phase-locked loop contains a phase detector 14, which receives an input reference signal (e.g., 25 MHz), a charge pump 16, a loop filter 18 and a voltage-controlled oscillator (VCO) 20, which generates an output signal having a frequency that is an integer multiple of the frequency of the input reference signal. Multiple fractional-N dividers 22a-22d may be provided for generating output signals having different frequencies, which do not have integer relationships with the output frequency of the VCO 20. As will be understood by those skilled in the art, additional circuitry may be needed to reduce jitter in the signals generated by the dividers 22a-22d. The dividers 22a-22d may be provided as interpolative dividers as disclosed at FIGS. 4-6 of the '510 patent to Huang. For example, as shown by FIG. 5 of Huang, an interpolative divider can include a fractional-N divider, which receives a VCO clock. A first order delta sigma modulator receives a digital divide ratio (M/N). The integer portion of the digital divide ratio is supplied to the fractional-N divider as a divide control signal, which can be a stream of integers that approximate the fractional divide ratio. A digital quantization error, which corresponds to the fractional portion of the divide ratio, is supplied to a digitally controlled phase interpolator. The jitter introduced by the fractional-N divider can be canceled by interpolation in the phase interpolator, which is based on the digital quantization error supplied by the delta sigma modulator. In this manner, the input clock from the VCO is first divided down by the fractional-N divider according to the control information provided by the delta sigma modulator and then the phase interpolator operates to cancel quantization errors in the output of the fractional-N divider.

Additional examples of fractional-N frequency synthesizers, which utilize an accumulator within a numerically-controlled oscillator and a phase interpolator, are disclosed at FIG. 6 of the '510 patent to Huang and in U.S. Pat. No. 7,724,097 to Carley et al., entitled "Direct Digital Synthesizer for Reference Frequency Generation." Digitally-controlled oscillators containing interpolative dividers are also disclosed in U.S. Pat. No. 8,441,291 to Hara et al., entitled "PLL Using Interpolative Divider as Digitally Controlled Oscillator," and U.S. Pat. No. 8,248,175 to Hara, entitled "Oscillator with External Voltage Control and Interpolative Divider in the Output Path." In addition, U.S. Pat. No. 8,692,599 to Gong et al., entitled "Interpolative Divider Linearity Enhancement Techniques," discloses a clock synthesizer that utilizes a phase interpolator calibration signal, which is based on an error signal indicative of phase interpolation error.

Still further examples of fractional-N frequency synthesizers are disclosed in commonly assigned U.S. Pat. No. 8,559,587 to Buell et al., entitled "Fractional-N Dividers Having Divider Modulation Circuits Therein with Segmented Accumulators," the disclosure of which is hereby incorporated herein by reference. In particular, in FIGS. 2A-2B of the '587 patent, a fractional-N divider circuit 100 is illustrated as including a multi-modulus divider 102, which is configured to perform at least /N and /N+1 frequency division of a first reference signal ($REF_{HF}$) received at a first input thereof, where N is an integer greater than one. This multi-modulus divider 102 selectively performs a /N and /N+1 division according to a value of an overflow signal (OVERFLOW) received at a second input thereof. This overflow signal is generated by a divider modulation circuit and phase error calculator 104, which is shown as the divider modulation circuit 104a and the phase error calculator 104b. In particular, the overflow signal is generated in response to a digital code that specifies the sequence of division moduli to be used by the multi-modulus divider 102 when performing the /N and /N+1 frequency division of the first reference signal $REF_{HF}$.

The divider modulation circuit and phase error calculator 104 of FIG. 2A includes an accumulator 106 having multiple serially-cascaded accumulator segments 106a-106n therein. These segments 106a-106n generate a corresponding plurality of segments of a count value having at least one period of clock latency therebetween, in response to corresponding bits (LSB, . . . , MSB) of a digital code and corresponding segment overflow signals. The segments 106a-106n may be synchronized with a clock signal, which is shown as a signal ($f_1$) generated by the divider 102. For example, a relatively wide 16-bit segmented accumulator, which is typically needed for high resolution, may be defined by a cascaded arrangement of four 4-bit accumulator segments. The segmented accumulator 106 may provide advantages over typical accumulators within conventional delta-sigma modulators because the per cycle delay through the divider modulation circuit 104a is equivalent to the delay through a single segment (106a, . . . , 106n) of the accumulator 106, which may need to run at twice a frequency of an output signal (e.g., $F_{OUT}$). In this manner, the segments of the accumulator 106 operate collectively as an adder with at least one cycle (and typically many cycles) of latency. This segmented "adder" does not generate accurate counts with each clock signal, but ultimately yields a correct, albeit delayed, sequence of final overflow signals (from segment 106n) at a potentially much higher frequency rate. As further illustrated by FIG. 2A, the phase error calculator 104b includes a segment (e.g., four-bit) delay block 105a that compensates for the latency between the accumulator segment values associated with segments 106n-1 and 106n. An additional accumulator segment 107 and delay block 105b, which are optional, may be used within the phase error calculator 104b to produce a delta-sigma modulated signal that represents the value in the lower accumulator segments that do not directly feed a phase correction circuit 110.

This phase correction circuit 110 is configured to generate a second reference signal ($F_{OUT}$) in response to the divider output signal ($f_1$) generated by the multi-modulus divider 102. The phase correction circuit 110 includes a D-type flip-flop 112, which has a data terminal responsive to the second reference signal $F_{OUT}$ and a synchronization terminal responsive to the divider output signal $f_1$, and a pulse-width locked loop 114. This pulse-width locked loop 114 may include, among other things, an analog phase interpolator and a digital phase selection circuit, as shown by FIG. 2B.

The phase correction circuit 110 is illustrated as including a pulse-width locked loop 114 that utilizes a delay line containing a plurality of voltage-controlled delay cells 116a-116e to achieve a delay of one VCO period and an additional VCO cell 116f to provide equivalent loading. The pulse-width locked loop 114 further includes an XOR gate 118, which operates as a pulse generator to generate a pulse having a width of four delay blocks from the delay line, a charge pump 120 and capacitive loop filter $C_L$. As shown by the four inputs to each of the pair of multiplexers 122a-122b, digital phase selection in fine steps of $T_{VCO}/4$ can be achieved with analog phase interpolation being performed between these finer steps by an output multiplexer 124. This configuration yields two (2) bits of resolution allocated to the multiplexers and additional bits of resolution in the analog phase interpolator. Although not wishing to be bound by any theory, because the edges of the signals provided to the phase interpolator are closely spaced, they typically do not need to be filtered. The close spacing may also yield greater linearity and preclude any need for trimming.

Referring now to FIG. 3, another conventional fractional-N divider circuit 100' is shown as including a multi-modulus divider 102, which is configured to perform at least /N and /N+1 frequency division of a first reference signal ($REF_{HF}$) received at a first input thereof, where N is an integer greater than one. This multi-modulus divider 102 selectively performs a /N and /N+1 division according to a value of an overflow signal (OVERFLOW) received at a second input thereof. This overflow signal is generated by a divider modulation circuit and phase error calculator 104. In particular, the overflow signal is generated in response to a digital code that specifies the sequence of division moduli to be used by the multi-modulus divider 102 when performing the /N and /N+1 frequency division of the first reference signal $REF_{HF}$.

The divider modulation circuit 104a includes an accumulator 106 having multiple serially-cascaded accumulator segments 106a-106n therein. These segments 106a-106n generate a corresponding plurality of segments of a count value having at least one period of clock latency therebetween, in response to corresponding bits (LSB, . . . , MSB) of a digital code and corresponding segment overflow signals. The phase error calculator 104b includes a plurality of delay elements 105a-150b and an additional accumulator segment 107, which collectively generate multiple bits of a digital phase error that is provided to a phase correction circuit 110'. The accumulator segments 106a-106n and 107 are synchronized with a high frequency clock signal, which may be generated by a frequency multiplier 109.

This phase correction circuit 110' is configured to generate a second reference signal ($F_{OUT}$) in response to a divider output signal ($f_1$) generated by the multi-modulus divider 102. The phase correction circuit 110' is configured so that the second reference signal ($F_{OUT}$) has a substantially jitter-free and uniform duty cycle. The phase correction circuit 110' is illustrated as including a pair of latches (e.g., D-type flip-flops) 112a-112b, which have data terminals responsive to the second reference signal $F_{OUT}$ and synchronization terminals (e.g., clock terminals) responsive to true and complementary versions of the divider output signal $f_1$, which operates as a duty cycle adjustment circuit, and an analog phase interpolator 114'. This phase interpolator 114' may be configured as an analog multiplexer, which combines two edges of the signals generated by the flip-flops 112a-112b that are separate by one VCO period. Programmable filters 117a-117c are also provided for adjusting the edge rates of the input and output signals and, therefore, the linearity of the analog phase interpolator 114'.

SUMMARY OF THE INVENTION

Fractional divider (FD) circuits according to some embodiments of the invention include a multi-modulus divider (MMD), which is configured to generate a periodic output signal in response to: (i) a periodic reference signal ($REF_{HF}$), and (ii) a modulus control signal having a value that sets a frequency division ratio (1/P, 1/(P+1)) to be applied to the periodic reference signal. A phase correction circuit is provided, which is configured to generate an FD output signal in response to the periodic MMD output signal and a corrected multi-bit phase correction control (CPCC) signal during an active mode of operation. The phase correction circuit is further configured to generate an FD output signal in response to the periodic MMD output signal and a preliminary multi-bit phase correction control (PPCC) signal during a calibration mode of operation. A control circuit is provided, which is configured to generate the modulus control signal, the PPCC signal and the CPCC signal during the active mode of operation.

According to some of these embodiments of the invention, the control circuit is further configured to perform a self-calibration operation on the phase correction circuit during the calibration mode of operation. This self-calibration operation is performed by generating a mapping relationship between each of a plurality of preliminary multi-bit phase correction control (PPCC) values, which assume a high degree of phase correction linearity within the phase correction circuit, and a corresponding plurality of corrected multi-bit phase correction control (CPCC) values, which more accurately account for phase correction nonlinearity within the phase correction circuit as manufactured and operated during the active mode of operation.

According to still further embodiments of the invention, the control circuit is configured to generate the modulus control signal at a value that holds the frequency division ratio applied to the periodic reference signal by the MMD at a fixed calibration value (e.g., 1/P) during the calibration mode of operation. In addition, the control circuit may include a calibration divider, which is configured to apply a frequency division ratio to the periodic reference signal that is equivalent to the fixed calibration value (e.g., 1/P) during the calibration mode of operation. Moreover, during the calibration mode of operation, the control circuit preferably generates the mapping relationship (e.g., one-to-one mapping) by determining a degree of phase/time misalignment between a periodic calibration reference signal generated by the calibration divider and the FD output signal—for each of the plurality of preliminary multi-bit phase correction control (PPCC) values applied to the phase correction circuit. In particular, the control circuit may include a digital phase detector (e.g., time-to-digital (TDC) converter) to determine the degree of phase/time misalignment between the periodic calibration reference signal and the FD output signal.

In some of these embodiments of the invention, the mapping relationship is stored in a linearity calibration table within memory (e.g., non-volatile memory) in the control circuit. In addition, during the active mode of operation, the control circuit generates each corrected multi-bit phase correction control (CPCC) signal in response to performing a look-up in the linearity calibration table based on a corresponding preliminary multi-bit phase correction control (PPCC) signal.

According to still further embodiments of the invention, a fractional divider (FD) circuit may include a multi-modulus divider (MMD), which is configured to generate a periodic output signal in response to a periodic reference signal ($REF_{HF}$) and a modulus control signal having a value that sets a frequency division ratio to be applied to the periodic reference signal. A phase correction circuit, which may contain an analog phase interpolator, is provided. The phase correction circuit is configured to generate an FD output signal in response to the MMD output signal and a corrected multi-bit phase correction control (CPCC) signal. A control circuit is provided, which is configured to generate the modulus control signal, a preliminary multi-bit phase correction control (PPCC) signal and the corrected multi-bit phase correction control (CPCC) signal. The corrected multi-bit phase correction signal can be generated by performing a look-up in a linearity calibration table, which maps each of a plurality of values of the preliminary multi-bit phase correction control (PPCC) signal to a corresponding one of a plurality of values of a corrected multi-bit phase correction control (CPCC) signal, which more accurately account for phase correction nonlinearity within the phase correction circuit relative to the plurality of values of the preliminary multi-bit phase correction control (PPCC) signal. According to some of the embodiments of the invention, the control circuit may generate the linearity calibration table during a self-calibration mode of operation, which may occur during initial start-up, after reset, in response to temperature changes, etc. In addition, during this self-calibration mode of operation, the control circuit may generate the modulus control signal at a fixed value that holds the frequency division ratio applied to the periodic reference signal by the MMD at a fixed calibration ratio during the calibration mode of operation.

To further enable self-calibration, the control circuit may be provided with a calibration divider that is enabled during the calibration mode of operation. The calibration divider also applies the fixed calibration ratio to the periodic reference signal. The linearity calibration table may then be generated by the control circuit in response to determining a degree of phase/time misalignment between a periodic calibration reference signal generated by the calibration divider and the FD output signal for each of the plurality of preliminary multi-bit phase correction control (PPCC) values applied to the phase correction circuit. The phase/time misalignment may be measured using a digital phase detector.

Still further embodiments of the invention include fractional divider based phase-locked loops (FDPLLs). According to these embodiments of the invention, a FDPLL may contain a fractional divider configured to generate a periodic PLL output signal in response to a first periodic reference signal ($REF_{HF}$). The fractional divider includes a digital control circuit responsive to a digital control input signal and a multi-modulus divider (MMD), which is responsive to the first periodic reference signal and a first digital control output signal generated by the digital control circuit. A feedback divider (FD) is provided, which is configured to generate a periodic FD output signal in response to a periodic MMD output signal generated by the MMD. A digital phase detector (PD) is provided, which is configured to generate a PD output signal in response to the FD output signal and a second periodic reference signal (REF_CLK). A digital loop filter is provided, which is configured to generate the digital control input signal in response to the phase detector output signal as modified by a noise cancellation signal, which is generated by the digital control circuit. This noise cancellation signal is generated to at least partially compensate for non-random deterministic noise in the MMD output signal, which may be a relatively noisy signal relative to the PLL output signal.

According to still further embodiments of the invention, the first digital control output signal is synchronized to the MMD output signal and the noise cancellation signal is synchronized to the FD output signal, which has a lower frequency relative to the MMD output signal. In some of these embodiments, the fractional divider includes a phase interpolator, which is responsive to a second digital control output signal generated by the digital control circuit. This second digital control output signal may also be synchronized to the MMD output signal.

According to still further embodiments of the invention, the digital control circuit includes a register having a data input responsive to (at least) the second digital control output signal and the noise cancellation signal is derived from a digital signal generated at an output of the register. This register may utilize the FD output signal as a clock signal that synchronizes the frequency at which the noise cancellation signal is updated.

According to still further embodiments of the invention, a phase-locked loop (PLL) integrated circuit includes a fractional divider configured to generate a periodic PLL output signal in response to a first periodic reference signal ($REF_{HF}$). The fractional divider includes: (i) a digital control circuit, which is responsive to a digital control input signal, (ii) a multi-modulus divider (MMD), which is responsive to the first periodic reference signal and a first digital control output signal generated by the digital control circuit; and (iii) an analog phase interpolator responsive to a second digital control output signal generated by the digital control circuit. A feedback divider (FD) is also provided, which is configured to generate a periodic FD output signal in response to a periodic MMD output signal generated by the MMD. A digital phase detector (PD) is provided, which is configured to generate a PD output signal in response to the FD output signal and a second periodic reference signal. A digital loop filter is provided, which is configured to generate the digital control input signal in response to the phase detector output signal, as modified by a digital noise cancellation signal that varies in response to changes in the second digital control output signal. According to some embodiments of the invention, the noise cancellation signal can be an M-bit digital signal and the second digital control output signal can be an N-bit digital signal, where M and N are positive integers greater than four (4) and M is greater than N. In addition, changes in the second digital control output signal can be synchronized to the MMD output signal. In particular, the digital control circuit may include an accumulator that is synchronized to the MMD output signal and generates the second digital control output signal at an output thereof. The MMD output signal is typically "noisier" than the PLL output signal. Nonetheless, the noise in the MMD output signal may be treated as non-random deterministic digital noise that can be corrected/cancelled at the output of the digital phase detector and before the digital loop filter.

DETAILED DESCRIPTION OF EMBODIMENTS

Figure 1A:
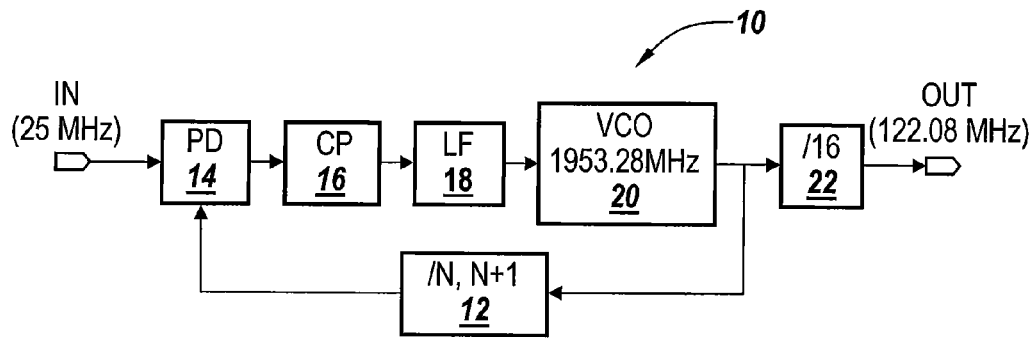
FIG. 1A is a block diagram of a frequency synthesizer that utilizes a fractional-N divider within a feedback path of a phase-locked loop (PLL), according to the prior art.
Figure 1B:
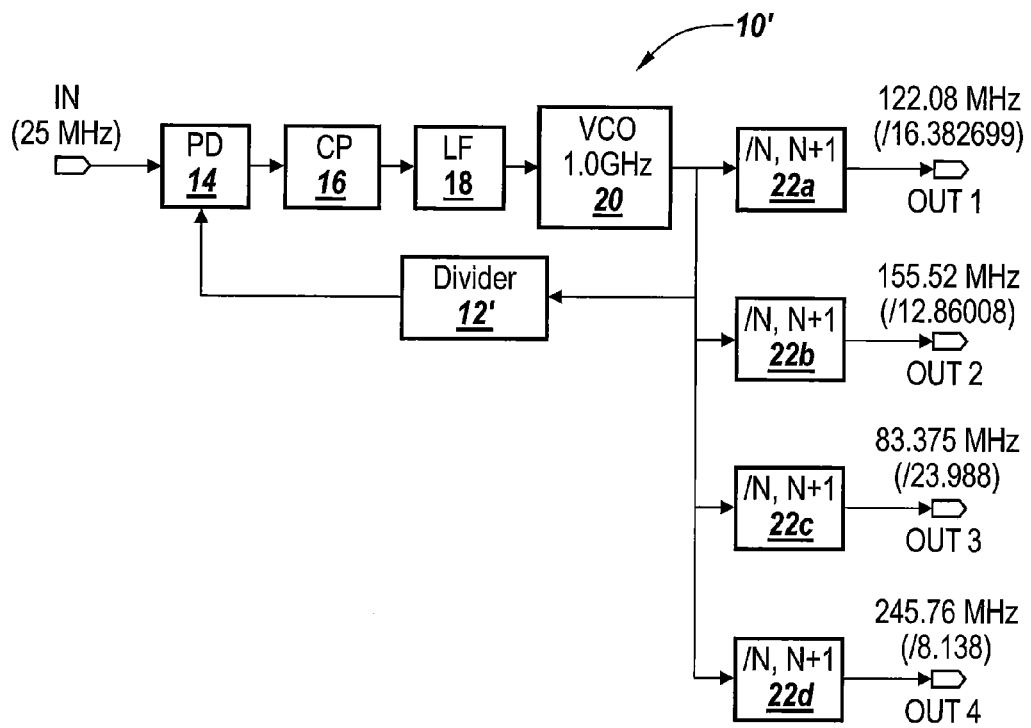
FIG. 1B illustrates a frequency synthesizer that utilizes an integer divider within a feedback path of a phase-locked loop (PLL), according to the prior art.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
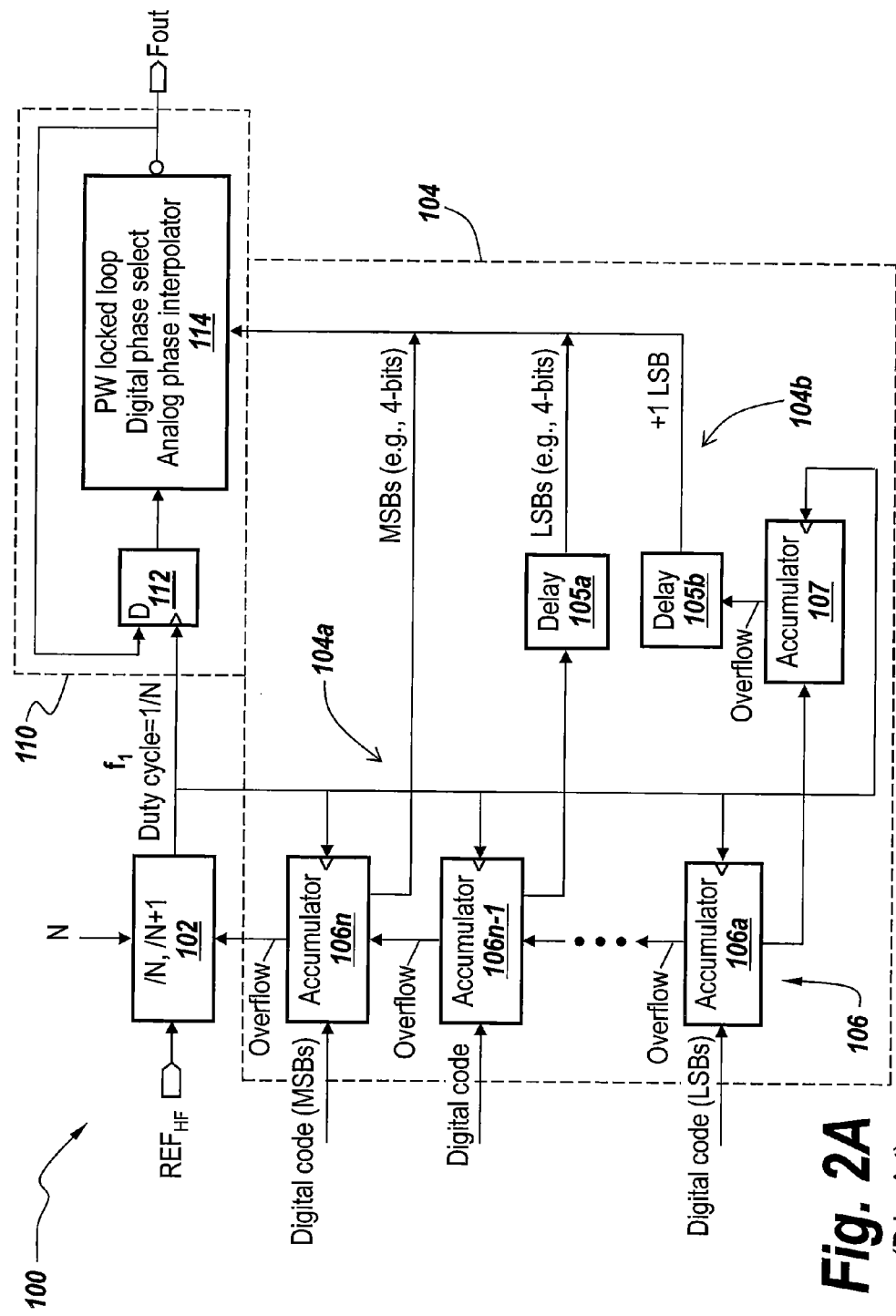
FIG. 2A is a block diagram of a fractional-N divider circuit containing a segmented accumulator, according to the prior art.
Figure 2B:
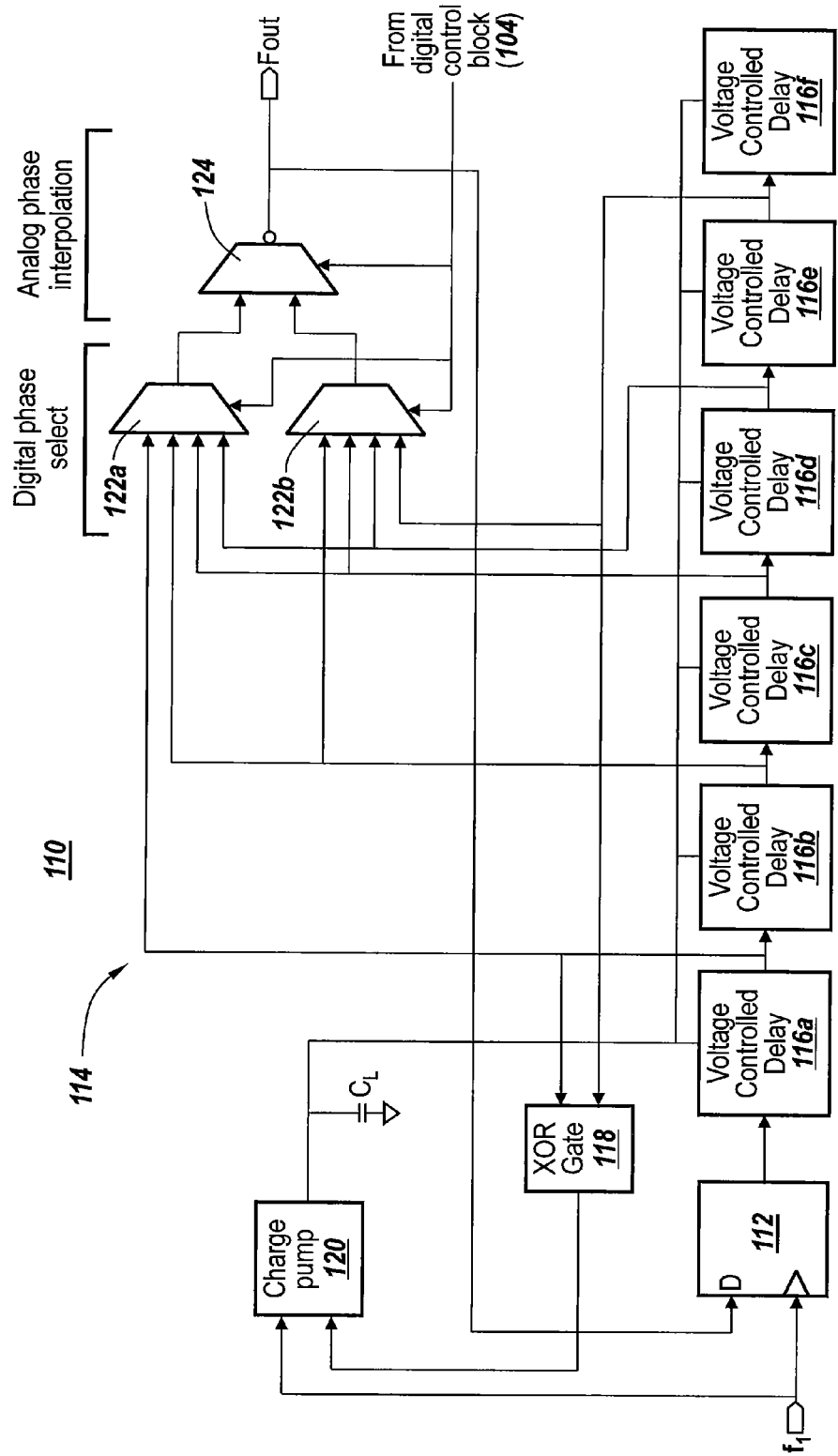
FIG. 2B is a block diagram of an embodiment of the phase correction circuit of FIG. 2A.
Figure 3:
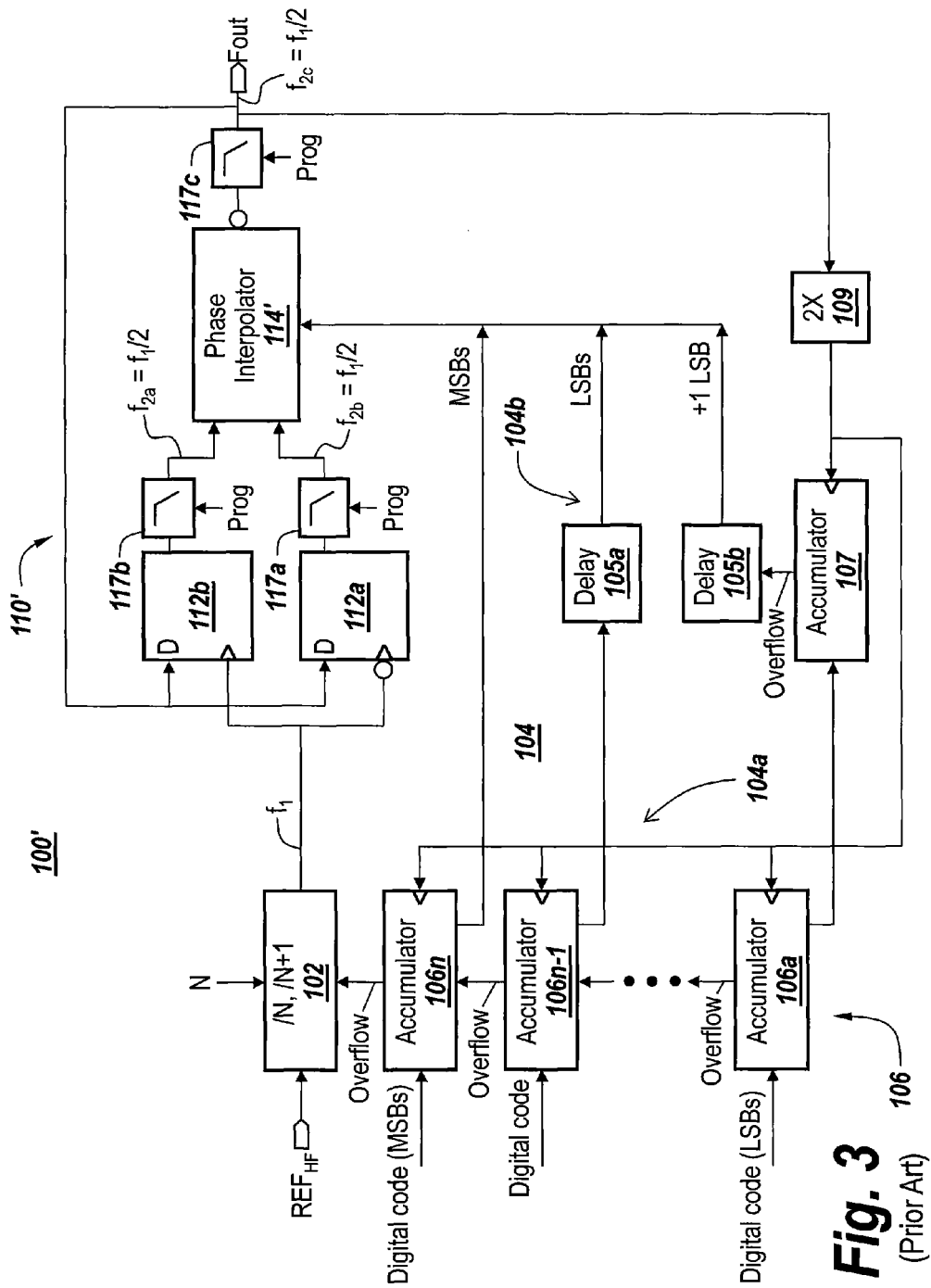
FIG. 3 is a block diagram of a fractional-N divider circuit containing a segmented accumulator, according to the prior art.
Figure 4:
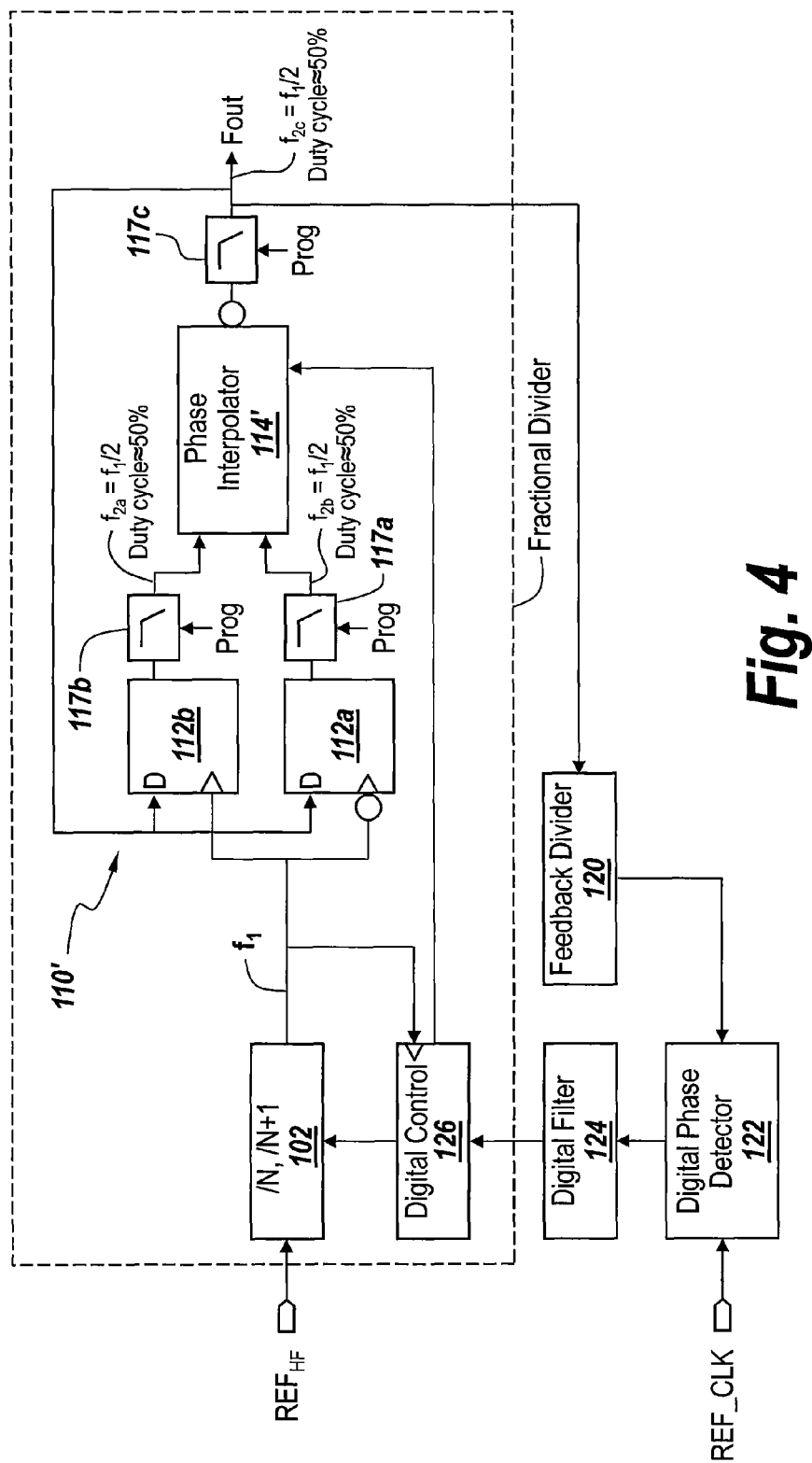
FIG. 4 is a block diagram of a PLL integrated circuit, which adds components to a conventional fractional divider.

As illustrated by FIG. 4, a fractional divider may be utilized in a forward signal path of a phase-locked loop (PLL) integrated circuit, by adding a feedback signal path utilizing a digital phase detector 122, a digital loop filter 124 and a feedback divider 120, connected as illustrated. This embodiment of a fractional divider is illustrated as including a digital control circuit 126, a multi-modulus divider (MMD) 102 and a phase correction circuit 110'. The operations of these components of the fractional divider are more fully described hereinabove with respect to FIGS. 2A-2B and 3 and in the aforementioned commonly assigned '587 patent, which is hereby incorporated herein by reference.

One potential limitation in the performance of the fractional divider based PLL of FIG. 4 stems from the fact that the potentially high fidelity PLL analog output signal (Fout) may be fed back to produce a lower frequency and relatively noise free (e.g., jitter free) feedback signal to an input of the digital phase detector 122, which performs phase comparison operations relative to REF_CLK. As will be understood by those skilled in the art, a less active signal(s) at the input(s) of the digital phase detector 122 can increase a likelihood of "dead-zone" operation therein, which can limit performance of the PLL.

Figure 5A:
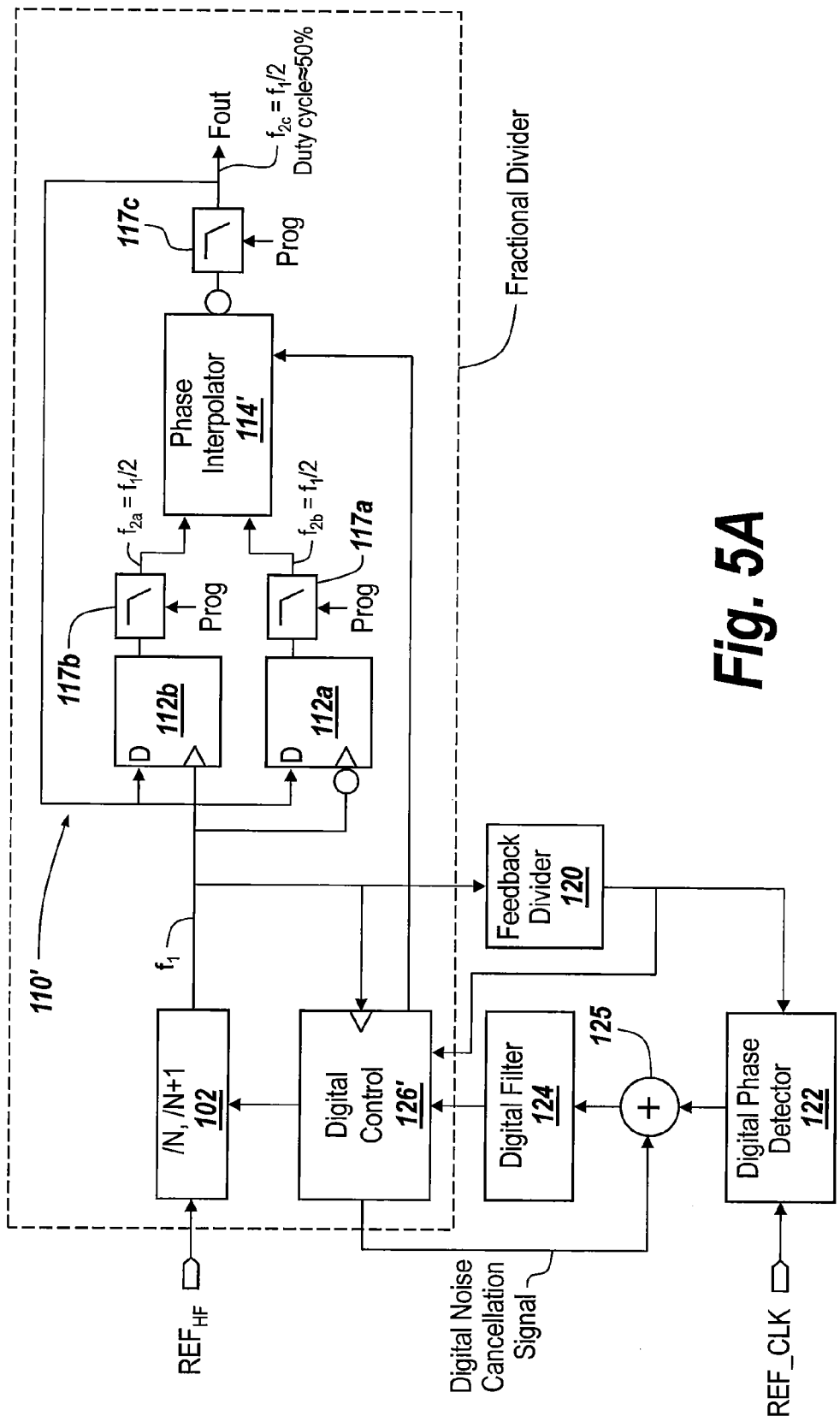
FIG. 5A is a block diagram of a PLL integrated circuit with digital noise cancellation, according to an embodiment of the invention.

Referring now to FIG. 5A, a fractional divider based phase-locked loop (FDPLL) according to some embodiments of the invention is illustrated as including a modified digital control circuit 126' within a fractional divider, and a feedback circuit including a feedback divider 120, a digital phase detector 122, a digital adder 125 and a digital loop filter 124, connected as illustrated. As shown, the digital adder 125 operates to combine a digital noise cancellation signal generated by the digital control circuit 126' with a signal generated at an output of the digital phase detector 122.

As will now be described with respect to FIGS. 5A-5B, a fractional divider based phase-locked loop (FDPLL) according to an embodiment of the invention is less susceptible to "dead-zone" operation within the digital phase detector 122 and may have higher resolution and better linearity compared to the PLL of FIG. 4. To achieve this enhanced level of operation, a more "active" signal is provided as feedback to an input of the digital phase detector 122. This more active input signal is derived from an output signal ($f_1$) generated by the multi-modulus divider (MMD) 102, which is passed through a feedback frequency divider 120 to a first input of the digital phase detector 122, as illustrated. This higher degree of "activity" in the feedback signal provided to the digital phase detector 122 is a consequence of a higher level of non-random deterministic "noise" (e.g., jitter) in the MMD output signal ($f_1$), which is created as a direct consequence of the modulus control (i.e., /N versus /N+1) provided by the digital control circuit 126'. Because this modulus control results in deterministic "noise" (e.g., known jitter) in the MMD output signal ($f_1$), it can be digitally removed from an output of the digital phase detector 122, as described more fully hereinbelow.

In FIG. 5A, the feedback divider 120 within the feedback circuit generates a reduced frequency output signal in response the MMD output signal ($f_1$). This feedback divider 120, which may be an integer or fractional divider, also provides the reduced frequency output signal as a synchronizing signal to the digital control circuit 126', as explained more fully hereinbelow with respect to FIG. 5B. Using known operations, the digital phase detector 122 generates a phase detector output signal in response to determining a phase difference between a reference clock (REF_CLK) and the reduced frequency output signal generated by the feedback divider 120. The phase detector output signal is provided to the digital adder 125 and modified by the noise cancellation signal generated by the digital control circuit 126', as shown. The digital loop filter 124 receives the modified phase detector output signal and performs a digital filtering operation using known techniques. An output signal generated by the digital loop filter 124 is provided as an input data signal to the digital control circuit 126'. As shown by FIG. 5B, the multi-bit signal generated by the digital loop filter 124 includes integer and fractional components, which are provided to the digital adder 127 and accumulator 130, respectively. Using known techniques, such as those described in the aforementioned '587 patent, the digital adder 127 combines the integer component of the output signal generated by the digital loop filter 124 with an overflow signal generated by the accumulator 130. As will be understood by those skilled in the art, the accumulator is synchronized to the MMD output signal ($f_1$).

Figure 5B:
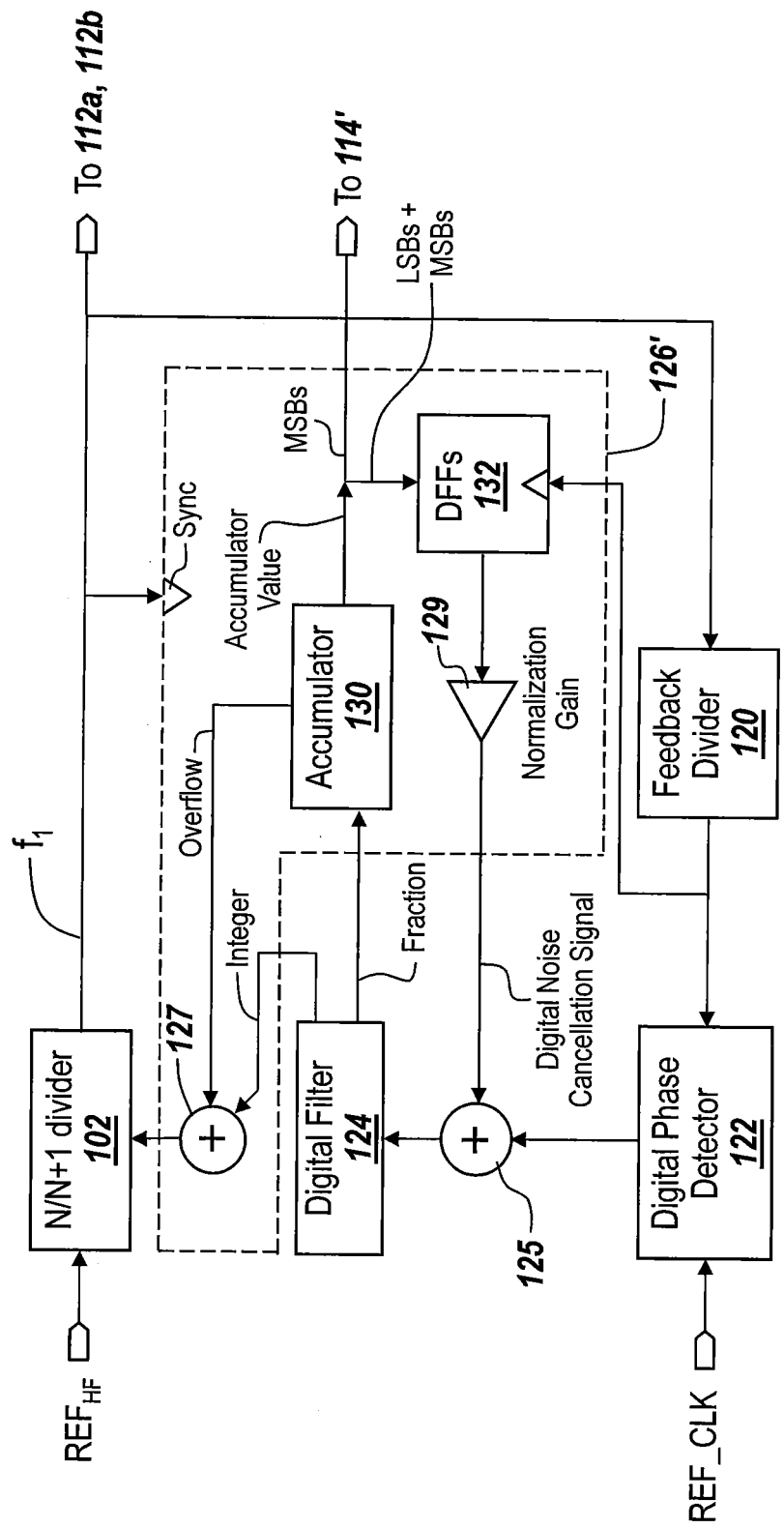
FIG. 5B is a block diagram of a portion of the PLL integrated circuit of FIG. 5A.

As further shown by FIG. 5B, the most significant bits (e.g., 8 MSBs) of the accumulator value signal generated by the accumulator 130 are provided to control operation of the analog phase interpolator 114' within the fractional divider. In contrast, the most significant bits and least significant bits (LSBs) of the accumulator value signal are provided to an M-bit register 132, which may be configured from D-type flip-flops (DFFs) that are synchronized to the reduced frequency output signal generated by the feedback divider 120. Based on calibration operations during start-up, etc., a programmable non-unity digital scaling operation (e.g., normalization) may be performed on the M-bit output of the register 132 to thereby yield a digital noise cancellation signal, which is provided to the digital adder 125. Although not wishing to be bound by any theory, an accumulator value calculated within a circuit that controls operation of the MMD 102 and analog phase interpolator 114' can be used to provide digital noise cancellation in the PLL feedback circuit. This noise cancellation, as described herein, can have higher resolution and better linearity compared with "analog" noise cancellation, which can be achieved by feeding back the PLL output signal, as shown by FIG. 4.

Figure 6:
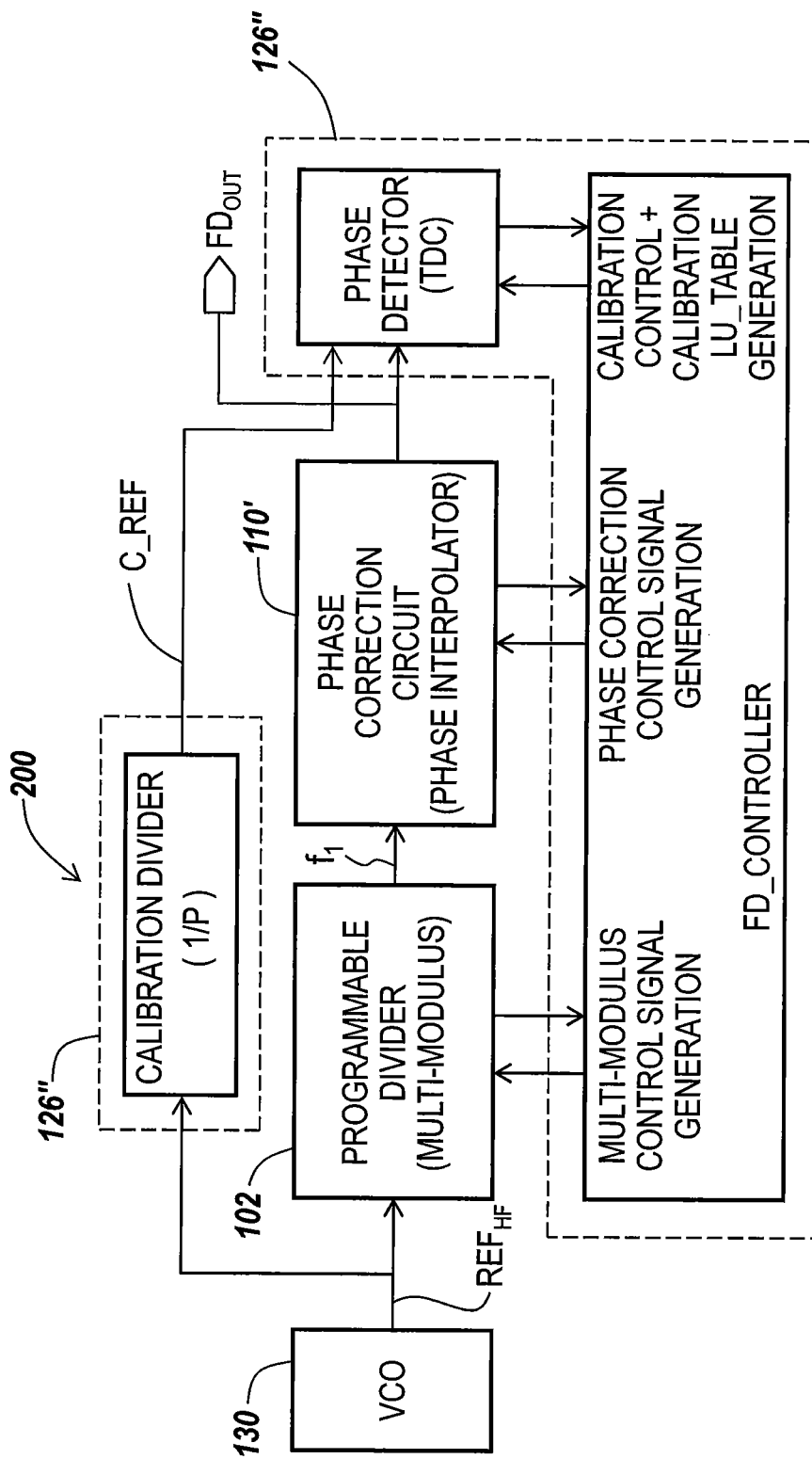
FIG. 6 is a block diagram of a self-calibrating fractional divider (FD) circuit according to embodiments of the invention.

Referring now to FIG. 6, a fractional divider (FD) circuit 200 according to an embodiment of the invention is illustrated as including a multi-modulus divider (MMD) 102, a phase correction circuit 110' and a control circuit 126", connected as illustrated. The MMD 102 and phase correction circuit 110' may be of conventional design. As described hereinabove, the MMD 102 is configured to generate a periodic output signal ($f_1$) in response to a periodic reference signal (REF$_{HF}$), which may be generated as a relatively high frequency periodic signal by a voltage-controlled oscillator (VCO) 130. The MMD 102 is also responsive to a multi-bit modulus control signal having a value that sets a frequency division ratio (e.g., 1/P, 1/(P+1)) to be applied to the periodic reference signal (REF$_{HF}$) during an active mode of operation. This modulus control signal is shown as being generated by an FD controller within the control circuit 126". In some embodiments of the invention, the FD circuit 200 may be utilized independently as a fractional divider or as part of a larger oscillator circuit, such as the FDPLL of FIGS. 5A-5B. Similarly, a portion of the FD controller of FIG. 6, which is responsible for the generation of the modulus control signal, may be configured as the digital control circuit 126' of FIGS. 5A-5B.

The control circuit 126" is illustrated as including the FD controller, a digital phase detector, which operates as a time-to-digital converter (TDC), and a calibration divider. Among other operations, this FD controller performs: (i) multi-modulus control signal generation; (ii) phase correction control signal generation during both a self-calibrating mode of operation and a "normal" active mode of operation; and (iii) calibration control and calibration look-up table generation, as shown. Based on this configuration, the phase correction circuit 110' operates to generate an FD output signal (FD$_{OUT}$) in response to the periodic output signal ($f_1$) generated by the MMD 102 and a corrected multi-bit phase correction control (CPCC) signal, which is generated by the FD controller during the active mode of operation. Moreover, according to preferred embodiments of the invention, the phase correction circuit 110' is further configured to generate the $FD_{OUT}$ signal as a test signal that supports calibration, in response to the periodic MMD output signal and a preliminary multi-bit phase correction control (PPCC) signal, which is generated by the FD controller during the calibration mode of operation. As explained more fully hereinbelow, the preliminary multi-bit phase correction control (PPCC) signal is repeatedly generated during calibration to support the generation of the calibration look-up table. Moreover, during the active mode of operation, the PPCC signal is generated as a pointer into the look-up table so that a corresponding CPCC signal can be acquired and used as a control signal to the phase correction circuit 110'.

In particular, the control circuit 126" is configured to perform a diagnostic self-calibration operation on the phase correction circuit 110' by generating a mapping relationship between each of a plurality of preliminary multi-bit phase correction control (PPCC) values (e.g., N-bit values), which assume ideal operation, or at least a very high degree of phase correction linearity within the phase correction circuit 110', and a corresponding plurality of corrected multi-bit phase correction control (CPCC) values (e.g., M-bit values, where M≥1), which more accurately account for phase correction nonlinearity within the phase correction circuit 110' as manufactured and operated during the active mode of operation. As will be understood by those skilled in the art, process, voltage and temperature (PVT) variations may impact the linearity of operation of the phase correction circuit 110' and potentially render the originally calculated PPCC values insufficient to support high level performance.

To perform this self-calibration, the FD controller generates a modulus control signal at a value that holds the frequency division ratio applied to the periodic reference signal ($REF_{HF}$) by the MMD 102 at a fixed calibration value (e.g., 1/P) during the calibration mode of operation. Likewise, the calibration divider within the control circuit 126" is configured to apply a frequency division ratio to the periodic reference signal ($REF_{HF}$) that is equivalent to the fixed calibration value (e.g., 1/P) during the calibration mode of operation, but is disabled during the active mode of operation. In response to performing these preliminary self-calibration operations, the control circuit 126" generates the mapping relationship from PPCC-to-CPCC values by determining a degree of phase/time misalignment between a periodic calibration reference (C_REF) signal generated by the calibration divider and the "test" $FD_{OUT}$ signal—for each of the plurality of preliminary multi-bit phase correction control (PPCC) values applied by the FD controller to the phase correction circuit 110'. Thus, if the phase correction circuit 110' is responsive to a 8-bit phase correction control (PCC) signal, which may take the form of the accumulator MSBs shown in FIGS. 3 and 5B, for example, each CPCC signal may take one-of-256 different values, which means one full period (T) of the periodic reference signal ($REF_{HF}$) may be divided into 256 time intervals of equal duration (T/256). According to some embodiments of the invention, the 256 time intervals may be divided into 64 time intervals (64 TIs) with 4 sub-time intervals (4 STIs) for each TI. In this manner, each of 64 unique PPCC signals (i.e., 6-bit PPCC code) may be generated within the FD controller during an active mode of operation. In addition, each of the 64 unique PPCC signals may be generated during the calibration mode of operation to thereby yield a corresponding one of 64 CPCC signals, which more accurately account for an actual non-ideal linearity curve associated with the phase correction circuit 110'.

For example, the mapping between each PPCC value and each CPCC value may be determined by treating each of the 256 time intervals associated with one full period of $HF_{REF}$ as being identified by the following TI.STI code: {0.0, 0.1, 0.2, 0.3, 1.0, 1.1, 1.2, 1.3, ..., 63.0, 63.1, 63.2, 63.3}, where PPCC={0.0, 1.0, ..., 20.0, 21.0, 22.0, 23.0, ..., 63.0} corresponds to a desired delay within the phase correction circuit 110' of: {0T, 4T/256, ..., 80T/256, 84T/256, 88T/256, 92T/256, ..., 252T/256}. However, because of the preferred mapping, which may be generated by the FD controller and stored in a non-volatile linearity calibration table (e.g., LU_TABLE) during the calibration mode of operation, the sequence of phase/time misalignment measurements for each of the 64 PPCC values (at 6-bit resolution)={0.0, 1.0, ..., 20.0, 21.0, 22.0, 23.0, ..., 63.0} may yield a corresponding group of 64 CPCC values (at 8-bit resolution)={0.2, 1.1, ..., 20.3, 22.1, 22.3, 23.1, ..., 63.2}, which more closely achieve the desired delays of: {0T, 4T/256, ..., 80T/256, 84T/256, 88T/256, 92T/256, ..., 252T/256}. Accordingly, when the control circuit 126" generates a 6-bit PPCC code during the active mode of operation, this 6-bit PPCC code can be used as a pointer when performing a look-up into the calibration table to thereby obtain an 8-bit CPCC code, which more accurately achieves an actual delay within the phase correction circuit 110' corresponding to the 6-bit PPCC code, which assumes ideal linear characteristics in the phase correction circuit 110'.

As another calibration example, both the PPCC and CPCC values may be generated as 7-bit codes ($2^7$=128), which means the phase correction circuit 110' can be treated "ideally" as having 128 delays as follows: (0b=0, 1b=T/128, 2b=2T/128, ..., 127b=127T/128). However, because the phase correction circuit 110' has analog imperfections (e.g., nonlinearities), the actual delays for a given 7-bit code, which will typically deviate from the ideal delays, can be determined during the calibration mode of operation. Thus, for example, the actual 128 delays may actually be: (0b=0, 1b=0.8T/128, 2b=1.6T/128, 3b=2.3T/128, 4b=3.0T/128, 5b=3.7T/128, 6b=4.8T/128, ..., 127b=127.51/128). The means the calibration table may be programmed as shown by TABLE 1, to achieve actual delays that are closer to ideal values:

TABLE 1

| Input code | Ideal delay | Real delay | Corrected code | Corrected delay |
|---|---|---|---|---|
| 0 | 0 | 0 | 0 | 0 |
| 1 | 1/128*T | 0.8/128*T | 1 | 0.8/128*T |
| 2 | 2/128*T | 1.6/128*T | 2 | 1.6/128*T |
| 3 | 3/128*T | 2.3/128*T | 4 | 3/128*T |
| 4 | 4/128*T | 3.0/128*T | 5 | 3.7/128*T |
| 5 | 5/128*T | 3.7/128*T | 6 | 4.8/128*T |

According to additional embodiments of the invention, an operation may be performed to dither between two closest CPCC values to thereby yield an "average" CPCC value ($CPCC_{avg}$) with an even higher level of accuracy. In some cases, the dithering may be symmetrically weighted, which means the pair of CPCC values are provided to the phase correction circuit 110' at equal frequency. However, in other cases, the dithering may be asymmetrically weighted, which means the pair of CPCC values are provided to the phase correction circuit 110' at unequal frequency. Accordingly, assuming the same delay values specified in TABLE 1, the following codes of TABLE 2 may be used.

TABLE 2

| Input code | Ideal delay | Real delay | Corrected codes | Corrected delay |
|---|---|---|---|---|
| 0 | 0 | 0 | 0 | 0 |
| 1 | 1/128*T | 0.8/128*T | 1 and 2 | 1 = 0.8/128*T, 2 = 1.6/128*T |
| DITHER: Use code "1" 75% of the time and use code "2" 25% of the time. | | | | |
| Effective result is the ideal "1/128*T". | | | | |
| 2 | 2/128*T | 1.6/128*T | 2 and 3 | 2 = 1.6/128*T, 3 = 2.3/128*T |
| DITHER: Use code "2" 3/7 of the time and use code "3" 4/7 of the time. | | | | |
| Effective result is the ideal "2/128*T". | | | | |
| 3 | 3/128*T | 2.3/128*T | 4 | 3/128*T |
| DITHER: Use code "4" all the time because the result is ideal. | | | | |
| 4 | 4/128*T | 3.0/128*T | 5 and 6 | 5 = 3.7/128*T, 6 = 4.8/128*T |
| DITHER: Use code "5" 8/11 of the time and use code "6" 3/11 of the time. | | | | |

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A fractional divider (FD) circuit, comprising:
a multi-modulus divider (MMD) configured to generate a periodic output signal in response to a periodic reference signal and a modulus control signal having a value that sets a frequency division ratio to be applied to the periodic reference signal;
a phase correction circuit configured to generate an FD output signal in response to the MMD output signal and a corrected multi-bit phase correction control signal during an active mode of operation and further configured to generate an FD output signal in response to the MMD output signal and a preliminary multi-bit phase correction control signal during a calibration mode of operation; and
a control circuit configured to generate the modulus control signal, the preliminary multi-bit phase correction control signal and the corrected multi-bit phase correction control signal during the active mode of operation, said control circuit further configured to perform a self-calibration of said phase correction circuit during the calibration mode of operation by generating a mapping relationship between each of a plurality of preliminary multi-bit phase correction control values, which assume a high degree of phase correction linearity within said phase correction circuit, and a corresponding plurality of corrected multi-bit phase correction control values, which account for phase correction nonlinearity within said phase correction circuit as manufactured and operated during the active mode of operation.

2. The fractional divider circuit of claim 1, wherein said control circuit is configured to generate the modulus control signal at a value that holds the frequency division ratio applied to the periodic reference signal by said MMD at a fixed calibration value during the calibration mode of operation.

3. The fractional divider circuit of claim 2, wherein said control circuit comprises a calibration divider configured to apply a frequency division ratio to the periodic reference signal that is equivalent to the fixed calibration value during the calibration mode of operation.

4. The fractional divider circuit of claim 3, wherein during the calibration mode of operation, said control circuit generates the mapping relationship by determining a degree of phase/time misalignment between a periodic calibration reference signal generated by the calibration divider and the FD output signal for each of the plurality of preliminary multi-bit phase correction control values applied to said phase correction circuit.

5. The fractional divider circuit of claim 4, wherein the mapping relationship is a one-to-one relationship.

6. The fractional divider circuit of claim 4, wherein the mapping relationship is stored in a linearity calibration table within said control circuit; and wherein during the active mode of operation, said control circuit generates each corrected multi-bit phase correction control signal in response to performing a look-up in the linearity calibration table based on a corresponding preliminary multi-bit phase correction control signal.

7. The fractional divider circuit of claim 4, wherein during the calibration mode of operation, said control circuit uses a digital phase detector to determine the degree of phase/time misalignment between the periodic calibration reference signal and the FD output signal.

8. The fractional divider circuit of claim 1, wherein in response to generation of a first preliminary multi-bit phase correction control signal during the active mode of operation, said control circuit generates and dithers between two corrected multi-bit phase correction control signals.

9. The fractional divider circuit of claim 1, wherein the mapping relationship is stored in a linearity calibration table within said control circuit; and wherein during the active mode of operation, said control circuit generates each corrected multi-bit phase correction control signal in response to performing a look-up in the linearity calibration table based on a corresponding preliminary multi-bit phase correction control signal.

10. A fractional divider (FD) circuit, comprising:
a multi-modulus divider (MMD) configured to generate a periodic output signal in response to a periodic reference signal and a modulus control signal having a value that sets a frequency division ratio to be applied to the periodic reference signal;
a phase correction circuit configured to generate an FD output signal in response to the MMD output signal and a corrected multi-bit phase correction control signal; and
a control circuit configured to generate the modulus control signal, a preliminary multi-bit phase correction control signal and the corrected multi-bit phase correction control signal, said corrected multi-bit phase correction signal generated by performing a look-up in a linearity calibration table that maps each of a plurality of values of the preliminary multi-bit phase correction control signal to a corresponding one of a plurality of values of a corrected multi-bit phase correction control signal, which more accurately account for phase correction nonlinearity within said phase correction circuit relative to the plurality of values of the preliminary multi-bit phase correction control signal.

11. The fractional divider circuit of claim 10, wherein said control circuit is further configured to generate the linearity calibration table during a calibration mode of operation.

12. The fractional divider circuit of claim 11, wherein said control circuit generates the modulus control signal at a fixed value that holds the frequency division ratio applied to the periodic reference signal by said MMD at a fixed calibration ratio during the calibration mode of operation.

13. The fractional divider circuit of claim 12, wherein said control circuit comprises a calibration divider configured to apply the fixed calibration ratio to the periodic reference signal during the calibration mode of operation.

14. The fractional divider circuit of claim 13, wherein during the calibration mode of operation, said control circuit generates the linearity calibration table by determining a degree of phase/time misalignment between a periodic calibration reference signal generated by the calibration divider and the FD output signal for each of the plurality of preliminary multi-bit phase correction control values applied to said phase correction circuit.

15. The fractional divider circuit of claim 14, wherein during the calibration mode of operation, said control circuit uses a digital phase detector to determine the degree of phase/time misalignment between the periodic calibration reference signal and the FD output signal.

16. The fractional divider circuit of claim 10, wherein in response to generation of a first preliminary multi-bit phase correction control signal during the active mode of operation, said control circuit generates and dithers between two corrected multi-bit phase correction control signals.

17. The fractional divider circuit of claim 10, wherein in response to generation of a first preliminary multi-bit phase correction control signal during the active mode of operation, said control circuit generates and dithers between two corrected multi-bit phase correction control signals using an asymmetric weighting of the two corrected multi-bit phase correction control signals.

\* \* \* \* \*